(12) United States Patent
Chu et al.

(10) Patent No.: US 10,026,647 B2
(45) Date of Patent: Jul. 17, 2018

(54) MULTI-METAL FILL WITH SELF-ALIGN PATTERNING

(71) Applicant: Taiwan Semiconductor Manufacturing Co., Ltd., Hsinchu (TW)

(72) Inventors: Wei-Chen Chu, Taichung (TW); Tai-I Yang, Hsinchu (TW); Cheng-Chi Chuang, New Taipei (TW); Chia-Tien Wu, Taichung (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days.

(21) Appl. No.: 15/498,259

(22) Filed: Apr. 26, 2017

(65) Prior Publication Data

US 2018/0166330 A1    Jun. 14, 2018

Related U.S. Application Data

(60) Provisional application No. 62/433,003, filed on Dec. 12, 2016.

(51) Int. Cl.
*H01L 21/768* (2006.01)
*H01L 21/311* (2006.01)
*H01L 23/522* (2006.01)
*H01L 23/528* (2006.01)
*H01L 23/532* (2006.01)

(52) U.S. Cl.
CPC .. *H01L 21/76816* (2013.01); *H01L 21/31111* (2013.01); *H01L 21/31116* (2013.01); *H01L 21/31144* (2013.01); *H01L 21/76834* (2013.01); *H01L 21/76897* (2013.01);
(Continued)

(58) Field of Classification Search
CPC ......... H01L 21/76816; H01L 21/31111; H01L 21/31116; H01L 21/31144; H01L 21/76834; H01L 21/76897
See application file for complete search history.

(56) References Cited

U.S. PATENT DOCUMENTS 5,918,122 A * 6/1999 Parekh ............. H01L 27/10852
257/E21.012
2004/0188806 A1* 9/2004 Chung ............. H01L 21/76829
257/621
(Continued)

*Primary Examiner* — Peniel M Gumedzoe
(74) *Attorney, Agent, or Firm* — Sterne, Kessler, Goldstein & Fox P.L.L.C.

(57) ABSTRACT

The present disclosure describes methods which employ a patterning photolithography/etch operations to form self-aligned interconnects with multi-metal gap fill. For example, the method includes a first pattern structure and a second pattern structure formed over a dielectric layer. Each of the first and second pattern structures includes a pair of spacers, and a center portion between the pair of spacers. A first opening, self-aligned to a space between the first and second pattern structures, is formed in the dielectric layer. A first conductive material is deposited in the first opening. The center portion of the second pattern structure is removed to form a void above the dielectric layer and between the pair of spacers of the second pattern structure. A second opening, self-aligned to the void, is formed in the dielectric layer; and a second conductive material is deposited in the second opening.

20 Claims, 11 Drawing Sheets

(52) U.S. Cl.
CPC ...... *H01L 23/5226* (2013.01); *H01L 23/5283* (2013.01); *H01L 23/53228* (2013.01); *H01L 23/53276* (2013.01)

(56) References Cited

U.S. PATENT DOCUMENTS

| | | | | |
|---|---|---|---|---|
| 2006/0157798 | A1* | 7/2006 | Hayashi | H01L 21/8221 257/374 |
| 2013/0119474 | A1* | 5/2013 | Schultz | H01L 21/76895 257/368 |
| 2014/0193974 | A1* | 7/2014 | Lee | H01L 21/76816 438/669 |

* cited by examiner

MULTI-METAL FILL WITH SELF-ALIGN PATTERNING

BACKGROUND

Photolithography misalignment can be responsible for patterning defects in Back End Of the Line (BEOL) metallization. Such patterning defects in BEOL can include line and vertical interconnect access (via) discontinuities, which can adversely impact product reliability and wafer yield.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
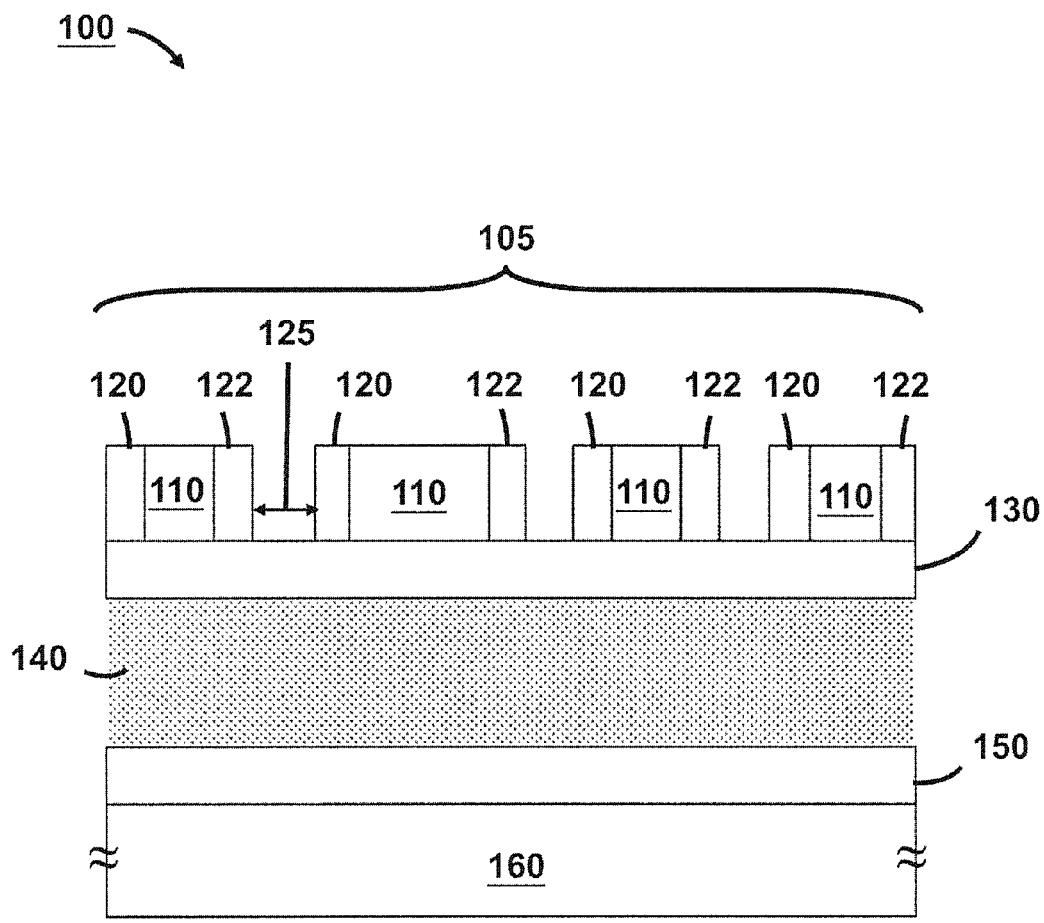
FIG. 1 is a cross-sectional view of an exemplary structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

The chip fabrication process can divided into three "modules," in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, field effect transistors (FETs) are formed. For example, FEOL includes the formation of source/drain terminals, a gate stack, and spacers on sides of the gate stack. The source/drain terminals can be doped substrate regions formed with an implantation process after the gate stack formation. The gate stack includes a metal gate electrode, which can include two or more metal layers. The gate dielectric can include a high dielectric constant (high-k) material (e.g., greater than 3.9, which is the dielectric constant of silicon oxide). Metals in the gate electrode set the work function of the gate, in which the work functions can be different between p-type FETs and n-type FETs. The gate dielectric provides electrical isolation between the metal gate electrode and a channel formed between the source and the drain terminals when the FET is in operation.

In MOL, low level interconnects (contacts) are formed and may include two layers of contacts on top of each other. The MOL interconnects can have smaller critical dimensions (CDs; e.g., line width) and are spaced closer together compared to their BEOL counterparts. A purpose of the MOL contact layers is to electrically connect the FET terminals, i.e., the source/drain and metal gate electrode, to higher level interconnects in BEOL. A first layer of contacts in MOL, known as "trench silicide (TS)" or "trench contacts (TC)," are formed over the source and drain terminals on either side of the gate stack. In the TS, or TC, configuration, the silicide is formed in the trench and after the trench formation. The silicide lowers the resistance between the source and drain regions and the metal contacts. The gate stack and the first layer of contacts are considered to be on the same "level." The second layer of contacts are formed over the gate electrode and TS. MOL contacts are embedded in a dielectric material, or a dielectric stack of materials, that ensures their electrical isolation.

In BEOL, an interlayer dielectric (ILD) is deposited over the MOL contacts. The formation of high level interconnects in BEOL involves patterning a hard mask (HM) layer and subsequently etching through the HM layer to form holes and trenches in the ILD. The ILD can be a low-k material. Low-k materials can have a dielectric constant below 3.9, which is the dielectric constant of silicon oxide ($SiO_2$). Low-k materials in BEOL can reduce unwanted parasitic capacitances and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. An interconnect layer can have one or more vias and one or more lines. BEOL may include multiple interconnect layers (e.g., up to 9 or more) with vias and lines of increasing CD size (e.g., line width) and line pitch. Each interconnect layer is required to align to the previous interconnect layer to ensure proper via and line connectivity.

Line connectivity can be established through an alignment between the pattern on a photomask (reticle) and existing features on a wafer surface. This quality measure is known as "overlay (OVL) accuracy." Alignment is critical because the reticle pattern must be precisely transferred to the wafer from layer to layer. Since multiple photolithography steps are used during patterning, any OVL misalignment is additive and contributes to the total placement tolerances between the different features formed on the wafer surface. The placement tolerances for each "photo-layer" are known as the "OVL budget." Each photo-layer can have a different OVL budget depending on the incoming OVL misalignment, and the size/density of the features to be transferred on the wafer's surface. Since OVL misalignments are additive, they can adversely affect the OVL budget of each photo-layer.

The wafer and the reticle position data are measured with respect to a coordinate system defined for the exposure tool and are then used in a global or field-by-field manner to perform the alignment. Global alignment, also known as "coarse alignment," can use several marks to quickly align a wafer relative to the reticle. Field-by-field alignment, also known as "fine alignment," can be used to align the reticle to each exposure site. The fine alignment can compensate for non-uniformities observed in the local topography, deposition non-uniformities, or dishing during chemical mechanical planarization (CMP) operations.

The use of a HM to form the interconnects in BEOL can have several limitations. For example, the use of a HM can limit the photolithography alignment window because the narrow patterned features present in the HM reduce the tolerance for misalignment errors. A reduction in alignment window increases the risk for overlay errors, which in turn translates to a higher probability of patterning defects on the wafer. Common patterning defects include metal bridges between vias and deformed vias or lines. Self-aligned interconnects can provide a relief to the photolithography alignment requirements and increase the alignment, or OVL, window. This is helpful for high density areas of the chip where the line pitch is small.

Various embodiments in accordance with this disclosure provide BEOL interconnect fabrication methods that employ a patterning process (i.e., a combination of photolithography and etch processes) with self-aligned interconnects resulting in a wider pattern for OVL. Self-aligned contacts effectively increase the OVL window and indirectly reduce the number of patterning defects. Furthermore, the process flow is simplified because a HM layer is no longer required. As would be understood by a person of ordinary skill in the art, interconnect fabrication methods in accordance with this disclosure support the use of multi-metal gap fill processes, which may be advantageous for future nodes. In this context, a metal can be any conductive material such as, for example, copper, cobalt, aluminum, or graphene.

FIG. 1 is a cross-sectional view of an exemplary structure 100 in accordance with some embodiments. Structure 100 includes pattern structures 105, in which each pattern structure 105 includes a mandrel 110, a first spacer 120, and a second spacer 122. Each mandrel 110 is a center portion of the pattern structure 105 and has a first spacer 120 disposed on a first side surface of mandrel 110, and a second spacer 122 disposed on the second side surface of mandrel 110. Hence, each mandrel 110 has a first and a second opposing spacer 120 and 122 respectively. In some embodiments, each mandrel 110 is amorphous silicon, silicon nitride or amorphous carbon. The thickness of mandrel 110 can range from 10 nm to about 100 nm. In some embodiments, spacers 120 and 122 are titanium oxide, titanium nitride, silicon oxide, or silicon nitride. The spacer thickness can range from 5 to 50 nm. In some embodiments, mandrels 110 and spacers 120, 122 act as an etch mask, in which a width of a via or line formed in structure 100 can be a distance 125. Distance 125 is the distance between a spacer 122 of a first mandrel 110 and a spacer 120 of a neighboring second mandrel 110.

Mandrels 110 and spacers 120,122 are disposed over an etch stop layer 130. By way of example and not limitation, etch stop layer 130 can be silicon carbide with nitrogen doping, silicon carbide with oxygen doping, silicon nitride, or silicon oxide. Etch stop layer 130 is used during the formation of mandrel 110 and has a thickness range between 1 and 100 nm. Etch stop etch stop layer 130 is disposed over low-k ILD layer 140. By way of example and not limitation, low-k ILD layer 140 has a thickness between 10 and 100 nm. In some embodiments, low-k ILD layer 140 can be a stack of dielectrics, such as a low-k dielectric—e.g., carbon doped silicon oxide—and another dielectric. By way of example and not limitation, low-k ILD layer 140 can be a low-k dielectric and a silicon carbide with nitrogen doping; a low-k dielectric and silicon carbide with oxygen doping; or a low-k dielectric with silicon nitride or a low-k dielectric with silicon oxide. In some embodiments, vias and lines are disposed in openings formed in layer 140.

Structure 100 also includes an etch stop layer 150 over substrate 160. By way of example and not limitation, etch stop layer 150 is titanium nitride, silicon nitride, silicon carbide with nitrogen doping or oxygen doping, or a metal oxide such as aluminum oxide ($AlO_x$). In some embodiments, etch stop layer 150 has a thickness between 1 and 100 nm. By way of example and not limitation, substrate 160 may be a bare semiconductor wafer or a partially fabricated semiconductor wafer that includes previously formed layers. In the latter case, substrate 160 may include multiple layers (e.g., FEOL layer, MOL layer, and partially formed BEOL layers) that need to be interconnected to layers formed in subsequent processing operations. For example, a via formed in low-k ILD 140 can be electrically connected to a layer within substrate 160.

Figure 2:
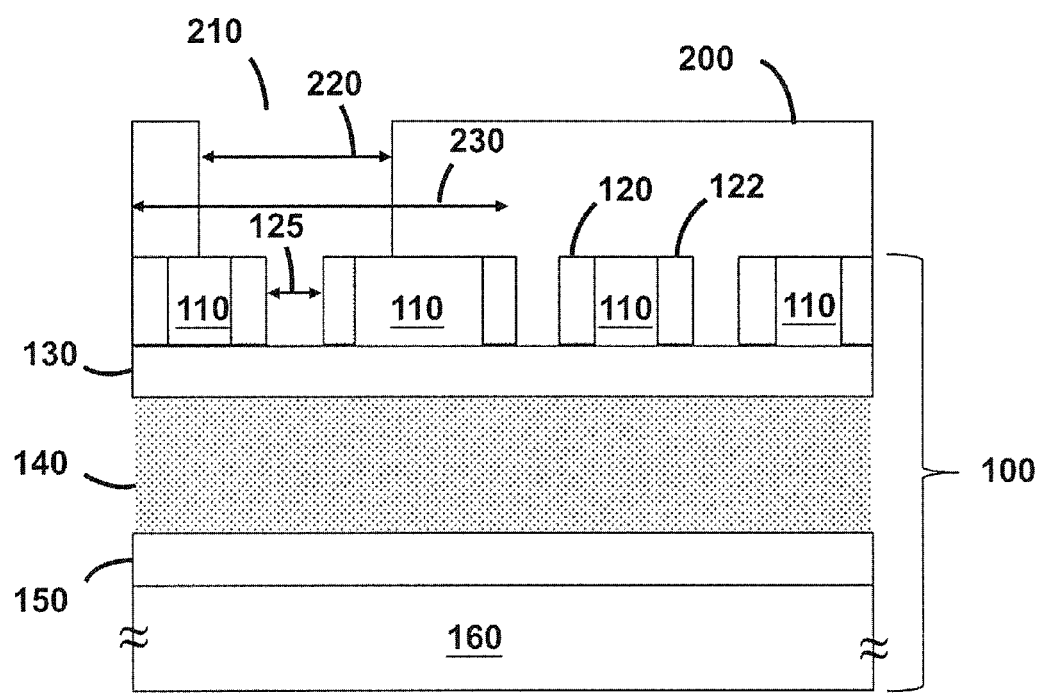
FIG. 2 shows a cross-sectional view of a structure after a layer of photoresist has been deposited and patterned in accordance with some embodiments.

In FIG. 2, a photoresist layer 200 is spin coated over pattern structures 105 to form opening(s) 210 with a width 220. The spin coating process involves four main steps:

dispense, spin-up, spin-off, and solvent evaporation. During the dispense step, the resist is dispensed on the wafer while the wafer is stationary or spinning very slowly. In the spin-up step, the wafer rotation speed increases to spread the resist over the entire wafer surface. During the spin-off step, excess photoresist material is removed to obtain a uniform resist film over the entire wafer surface. Finally, during the solvent evaporation step, the wafer continues to spin until the solvent from the photoresist evaporates and the photoresist film is nearly dry. After the photoresist application, the wafer is subjected to an annealing step known as a "soft bake" or a "pre-bake." A purpose of the pre-bake anneal is to remove any remaining solvent from the coated photoresist, to improve the adhesion of the photoresist, and to relieve the stress of the photoresist that occurred during the spin coating process.

The patterning of photoresist layer 200 can be performed by exposing different areas of the photoresist to ultra violet (UV) or extreme ultra violet (EUV) light according to the pattern in the photomask (reticle). A post exposure bake can be performed to initiate chemical reactions in the photoresist that change the solubility of the exposed areas of the photoresist. For a negative-tone photoresist, exposed areas are crosslinked (hardened) and become non-soluble in a developer solution. For a positive-tone photoresist, the non-exposed areas are crosslinked (hardened) and become non-soluble in a developer solution. In other words, for a negative tone photoresist the exposed areas are not removed and for a positive-tone resist the exposed areas are removed. Positive-tone photoresist can be used in submicron wafer fabrication due to its improved line width resolution.

After the photoresist exposure operation, the photoresist is developed. During the develop step, the photoresist is exposed to a developer solution that dissolves the non-crosslinked areas of the photoresist. As mentioned earlier, depending on the photoresist type (e.g., negative-tone or positive-tone), the non-soluble areas can be the exposed or non-exposed areas. After the developer step, the wafer is rinsed with de-ionized water (DI) and dried. A post-development thermal bake, also known as a "hard bake," can be performed to evaporate any residual solvent and harden the photoresist. Nominal hard bake temperatures for positive-tone resists can be about 130° C., and 150° C. for negative-tone photoresists. Photoresist layer 200 can be a negative or positive tone photoresists according to some embodiments.

Photoresist layer 200 is a compound that undergoes a change in solubility in a developer solution when exposed to an UV or EUV light. The purpose of photoresist layer 200 includes (i) exposing areas of structure 100 where vias will be formed with an etching process and (ii) protecting areas of structure 100 where vias should not be formed. In other words, the patterned photoresist is used as a mask layer for a subsequent etch process.

Because the via and line opening width is determined by distance 125, width 220 of opening 210 may be wider than width 125. In some embodiments, opening 210 can be as wide as width 230. The scenario assumes that the OVL error in the photolithography process is zero (no alignment error), and therefore width 220 shows no variation due to the photolithography process. In some embodiments, the misalignment errors are nonzero and therefore width 220 of opening 210 can be wider than distance 125, but width 220 cannot be wider than width 230 due to the variations in the photolithography process. Therefore, the OVL error contributes to the limit as to how close width 220 can be to width 230—which is the maximum width for opening 210 without any misalignment error. In some embodiments, the OVL window is considered to be at least wider than distance 125.

Figure 3:
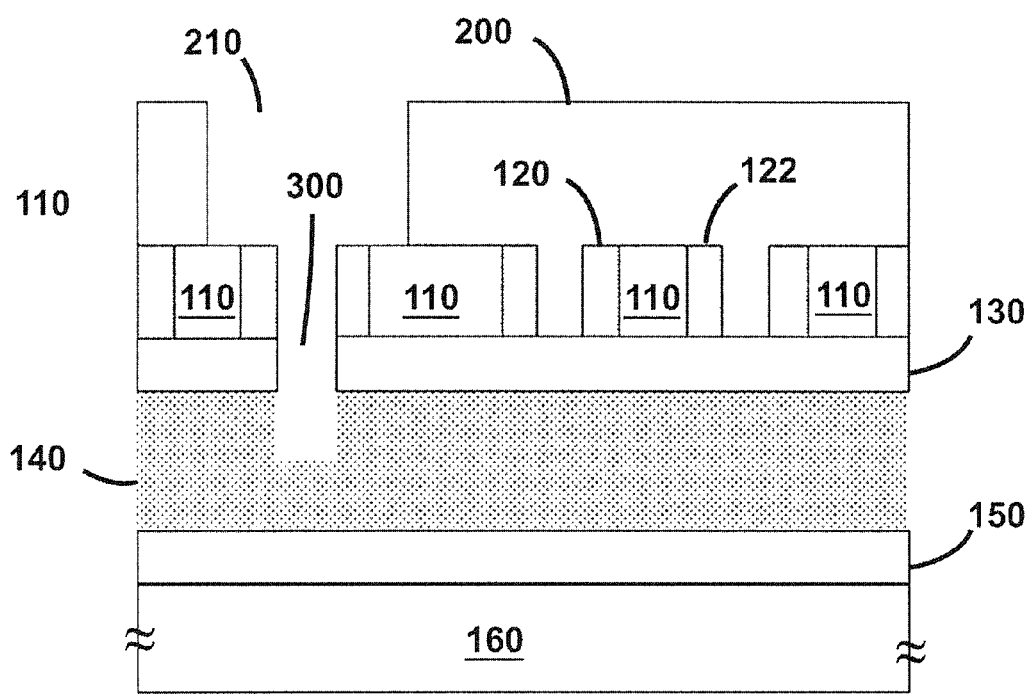
FIG. 3 shows a cross-sectional view of a structure after an opening has been partially etched through a self-aligned etching process in accordance with some embodiments.

Referring to FIG. 3, an etch process removes exposed areas of etch stop layer 130 and part of layer 140 through photoresist opening 210 to from a partial opening 300. In some embodiments, the etch process has high selectivity for etch stop layer 130 and low-k ILD layer 140. In some embodiments, an end-point of the etch process is reached after a predetermined amount of time. An etch process with an end point determined by an amount of time is referred to as a "timed etch." Since the etch process etches different materials—e.g., etch stop layer 130 and low-k ILD layer 140—the etch chemistry can be appropriately adjusted. As would be understood by a person of ordinary skill in the art, different etch gases can be used for each layer during a single etch operation. In addition to the etch chemistry, other etch process parameters such as, but not limited to, flow rate, temperature, pressure, may be adjusted to control the etch rate, etch profile, and uniformity.

Figure 4:
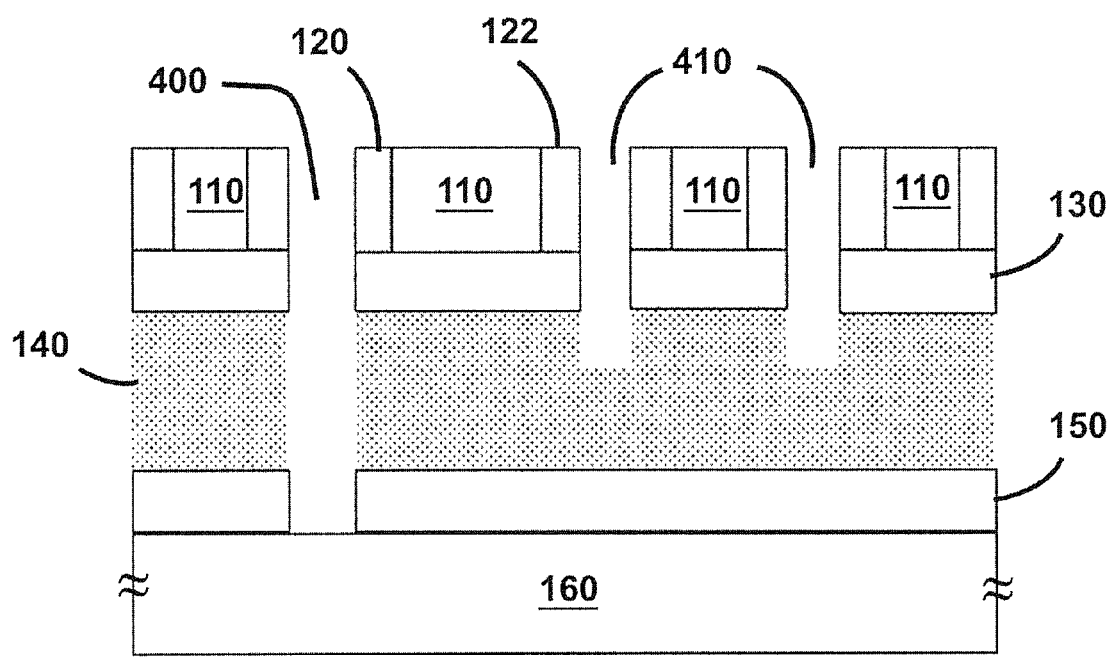
FIG. 4 shows a cross-sectional view of a structure after one or more openings have been etched by a self-aligned etching process in accordance with some embodiments.

Referring to FIG. 4, after the formation of opening 300, photoresist layer 200 is removed (or stripped) and a second etch is performed to complete the via and line formation. Subsequent to the end of the second etch, via opening 400 and line openings 410 are completed. Via openings, such as via opening 400, are used to electrically connect two or more layers in the vertical direction by substantially or completely filling the via openings with conductive material. By way of example and not limitation, via opening 400 stops on a metal line of a layer in substrate 160. Line openings, such as line openings 410, provide electrical connection within ILD layer 140, e.g., in a plane that is substantially parallel to the surface of the substrate. The second etch process can be highly selective towards etch stop layer 130 and low-k ILD 140.

As would be understood by a person of ordinary skill in the art, the etch process can be timed, end-pointed, or a combination of the two. For example, the etch process can be timed for the first part of the process and end-pointed towards the end. In this context, the end-pointed etch process automatically stops when the layer directly underneath the etched layer is detected; for example when the layer under layer 150 is detected. End point detection is possible because layer 150 and the underlying layer are made of different materials. Consequently, they can have different etch rates for a given etching chemistry. Detection of the underlying layer can be done through, for example, a change in the etch rate, which can be detected by in-situ metrology equipment such as, for example, an optical emission microscope. Since the optical emission microscope can be integrated into the etch chamber, the etch process can be monitored in real-time.

As would be understood by a person of ordinary skill in the art, the via opening formation is performed in a two-step etch process; while the line opening formation is performed in a single-step process.

Figure 5:
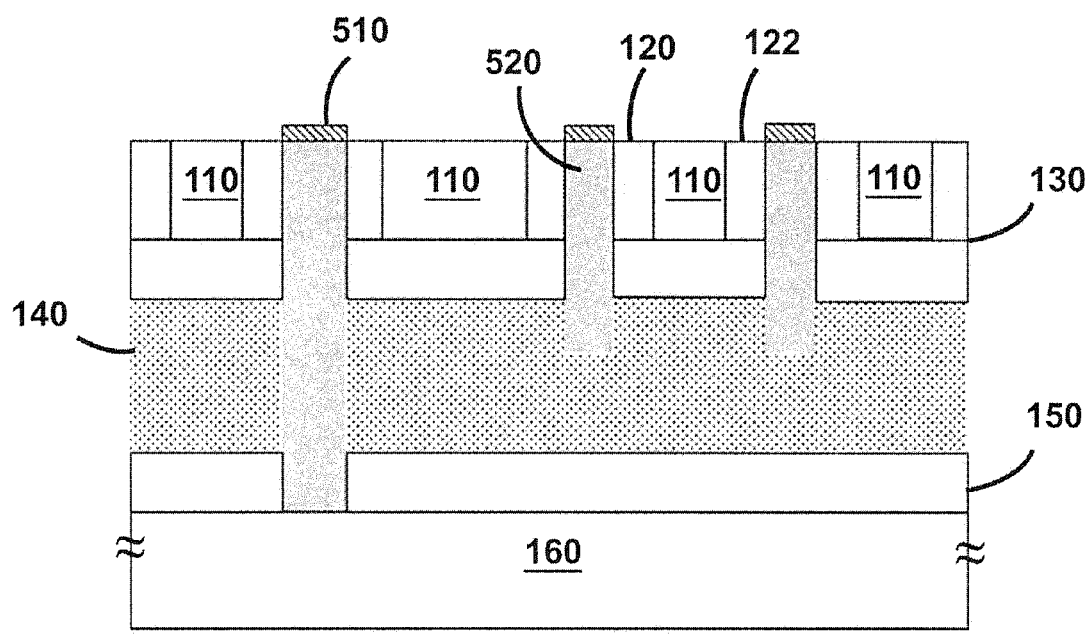
FIG. 5 shows a cross-sectional view of a structure after a conductive material fills openings in accordance with some embodiments.

FIG. 5 shows the structure of FIG. 4 after the via and line openings are filled with conductive material 520. The top surface of conductive material 520 is capped with an etch stop capping layer 510. In some embodiments, conductive material 520 is copper (Cu), cobalt (Co), aluminum (Al), graphene, or any other suitable conductive material. In some embodiments, etch stop capping layer 510 selectively grows on the conductive material. By way of example and not limitation, etch stop capping layer 510 is a metal oxide such as, for example, an Al-based, a Co-based, a tungsten (W)-based, a nickel (Ni)-based, or zirconium (Zr)-based oxide. As would be understood by a person of ordinary skill in the art, these are merely examples and other appropriate oxides may be used. By way of example and not limitation, etch stop capping layer 510 can be deposited with chemical vapor deposition (CVD), physical vapor deposition (PVD), or a spin-on process followed by a metal oxide patterning process. As would be understood by a person of ordinary skill in the art, a metal oxide patterning process can include photolithography, etch, and CMP processes. The role of etch stop capping layer 510 is to protect conductive material 520 from subsequent etching processes. In some embodiments, etch stop capping layer 510 enables multi-metal gap fill processes. In some embodiments, vias and lines filled with conductive material 520 form an interconnect layer.

In some embodiments, the formation of additional vias and lines requires the removal of mandrels 110 without the removal of spacers 120, 122. Removal of mandrels 110 may not be global, e.g., across the whole structure 100. For example, a patterned photoresist can be used to protect areas of structure 100 where removal of mandrels 110 is not desired. After the mandrel removal process, a resist strip operation removes the photoresist. As would be understood by a person of ordinary skill in the art, the resist strip can be accomplished with a wet etch.

Figure 6:
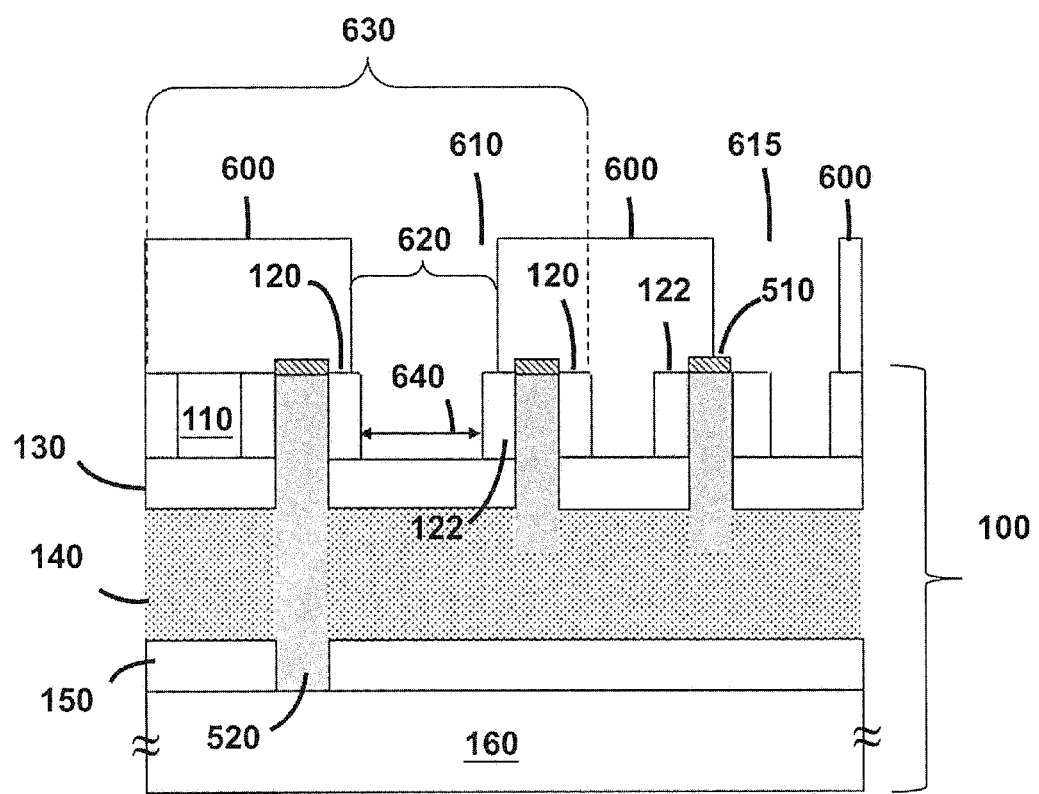
FIG. 6 shows a cross-sectional view of a structure after partial removal of patterns and a layer of photoresist has been deposited and patterned in accordance with some embodiments.

FIG. 6 shows the structure of FIG. 5 after photoresist is applied and patterned, and at least some of mandrels 110 are removed. To start the interconnect formation process, a fresh coat of photoresist 600 is applied on structure 100, and then patterned as shown in FIG. 6. At the end of the photoresist patterning process, openings 610 and 615 are formed in photoresist 600. During this process, the OVL window remains wide. For example, opening 610 has a width 620. In some embodiments, in which the OVL or misalignment error is zero, opening 610 may be as wide as width 630 for at least two reasons: (i) because the via/line opening width is defined by distance 640 between opposing spacers 120 and 122; and (ii) because etch stop capping layer 510 protects conductive material 520 from the etching chemistry and therefore if width 620 is wider and includes an area where conductive material 520 is exposed, the conductive material is protected from etching. In some embodiments, the misalignment errors are nonzero and therefore width 620 of opening 610 can be wider than distance 640, but cannot be wider than 630 due to variations in the photolithography process. Hence, the OVL error limits how close width 620 can be to width 630, which is a maximum width without any misalignment errors. This is also true for opening 615.

Figure 7:
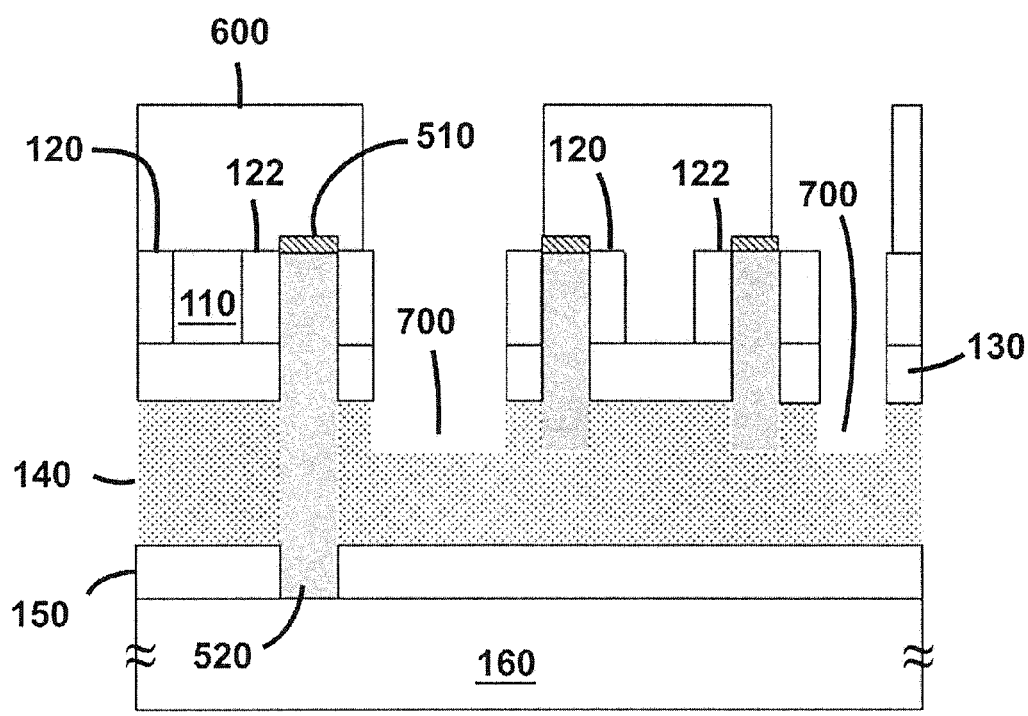
FIG. 7 shows a cross-sectional view of a structure after an opening has been partially etched by a self-aligned etching process in accordance with some embodiments.

Referring to FIG. 7, exposed areas of etch stop layer 130 shown in FIG. 6 have been etched through openings 610 and 615 while covered areas of structure 100 are protected from the etch. In some embodiments, a selective process removes exposed areas of etch stop layer 130 and part of layer 140 to form partial opening 700.

Figure 8:
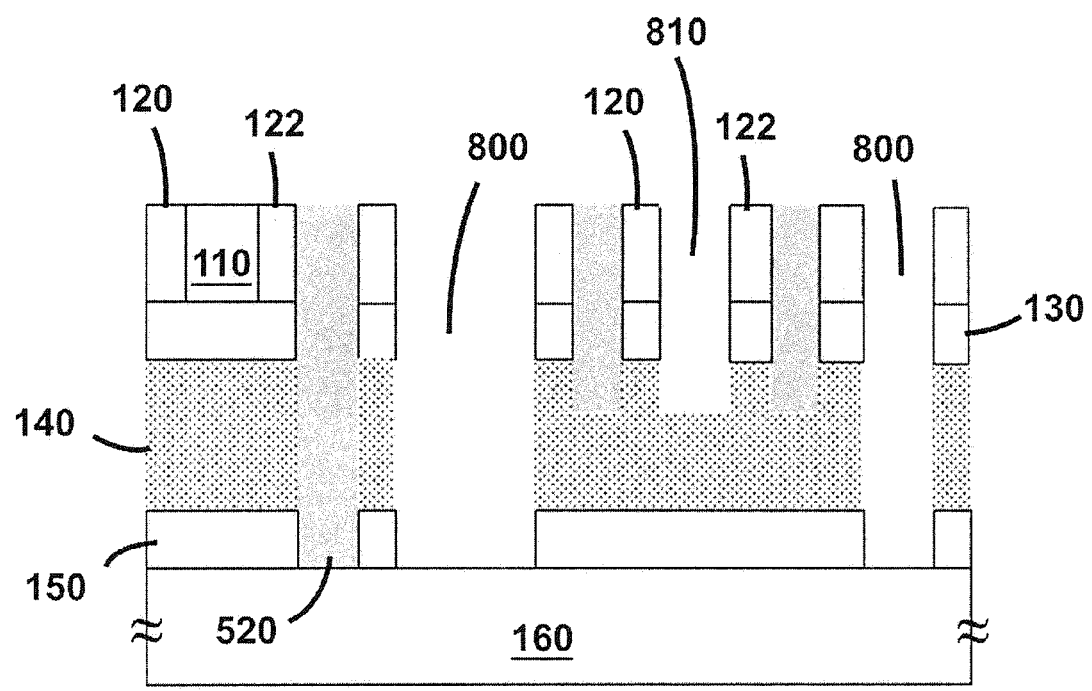
FIG. 8 shows a cross-sectional view of a structure after one or more openings have been etched by a self-aligned etching process in accordance with some embodiments.

FIG. 8 shows the structure of FIG. 7 after the photoresist has been stripped and a another etch process completes the formation of via openings 800 and line openings 810. By way of example and not limitation, the etch chemistry for the removal of etch stop layers 130, 150 may be different than the etch chemistry for layer 140. In some embodiments, the etch processes are highly selective for etch stop layer 130, 150 and low-k ILD layer 140 respectively. In some embodiments, the etch process is timed, end-pointed, or a combination of the two. For example, an etch process can be timed in the beginning of the process and end-pointed towards the end After the formation of via openings 800 and line openings 810, etch stop capping layer 510, shown in FIG. 7, is removed. In some embodiments, etch stop capping layer 510 is removed with a wet or dry etch. In some embodiments, the wet etch is a solution of hydrochloric acid and hydrogen peroxide, or a solution of phosphoric acid and hydrogen peroxide, or a solution of nitric acid and hydrogen peroxide. In some embodiments, the dry etch chemistry is fluorine- or chlorine-based such as $C_xH_yF_z$ and $B_xCl_y$, respectively. By way of example and not limitation, via opening 800 stops on a metal line of a layer in substrate 160.

Figure 9:
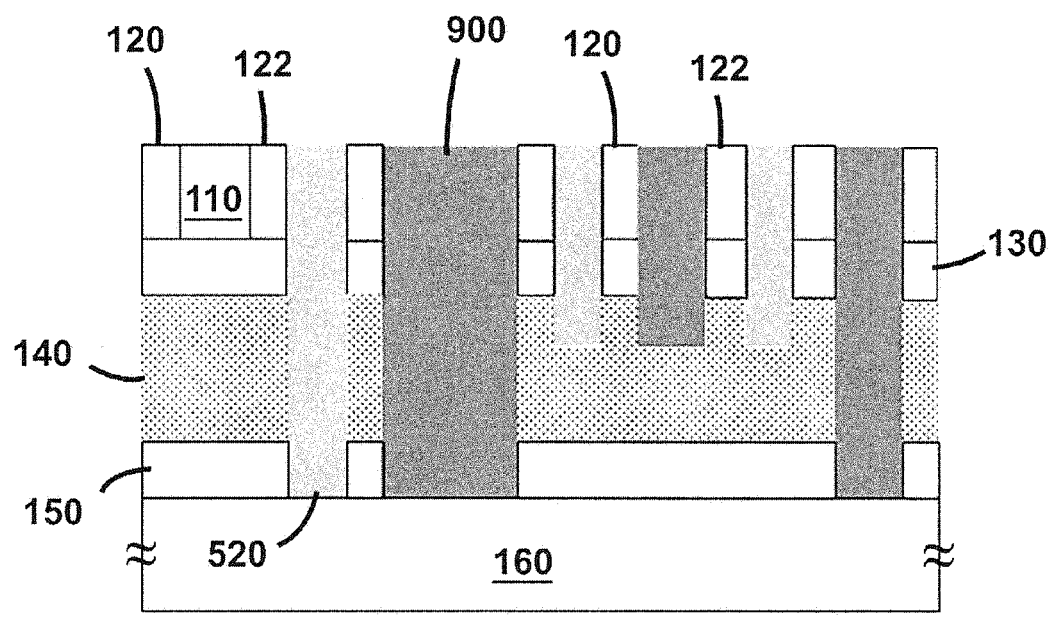
FIG. 9 shows a cross-sectional view of a structure after a conductive material fills openings in accordance with some embodiments.

FIG. 9 shows the structure of FIG. 8 after a conductive material 900 fills the via openings and line openings. In some embodiments, conductive material 900 is different than conductive material 520. In some embodiments, conductive material 900 is Al, Co, Cu, graphene, or any conductive material suitable for the desired electrical performance of the integrated circuit being fabricated. In some embodiments, vias and lines filled with conductive material 900 form an interconnect layer.

Figure 10:
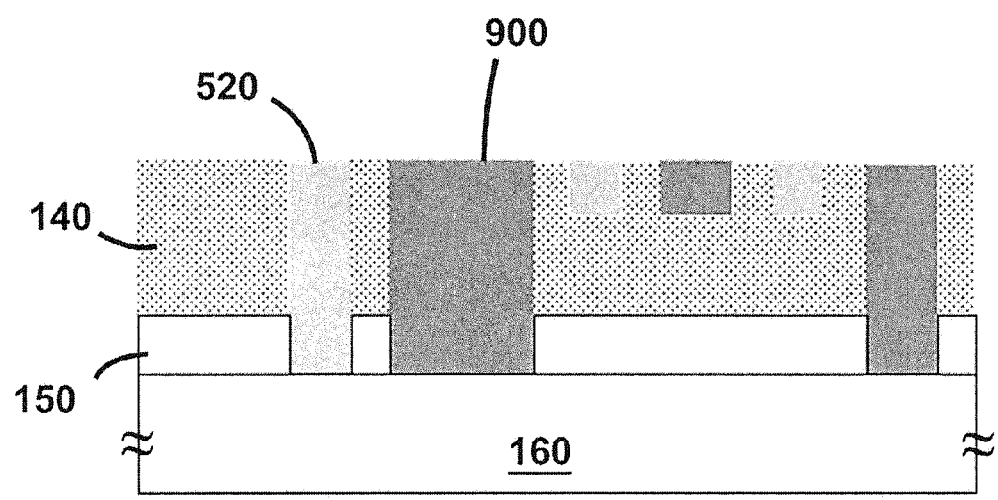
FIG. 10 is a cross-sectional view of an exemplary interconnect layer in accordance with some embodiments.

FIG. 10 shows the structure of FIG. 9 after a chemical mechanical polishing (CMP) process removes a top portion of structure 100 and stops at low-k ILD layer 140. In some embodiments lines or vias with different conductive material 520 and 900 are alternating as shown in FIG. 10. Other placement patterns for conductive materials 520 and 900 are possible.

Figure 11:
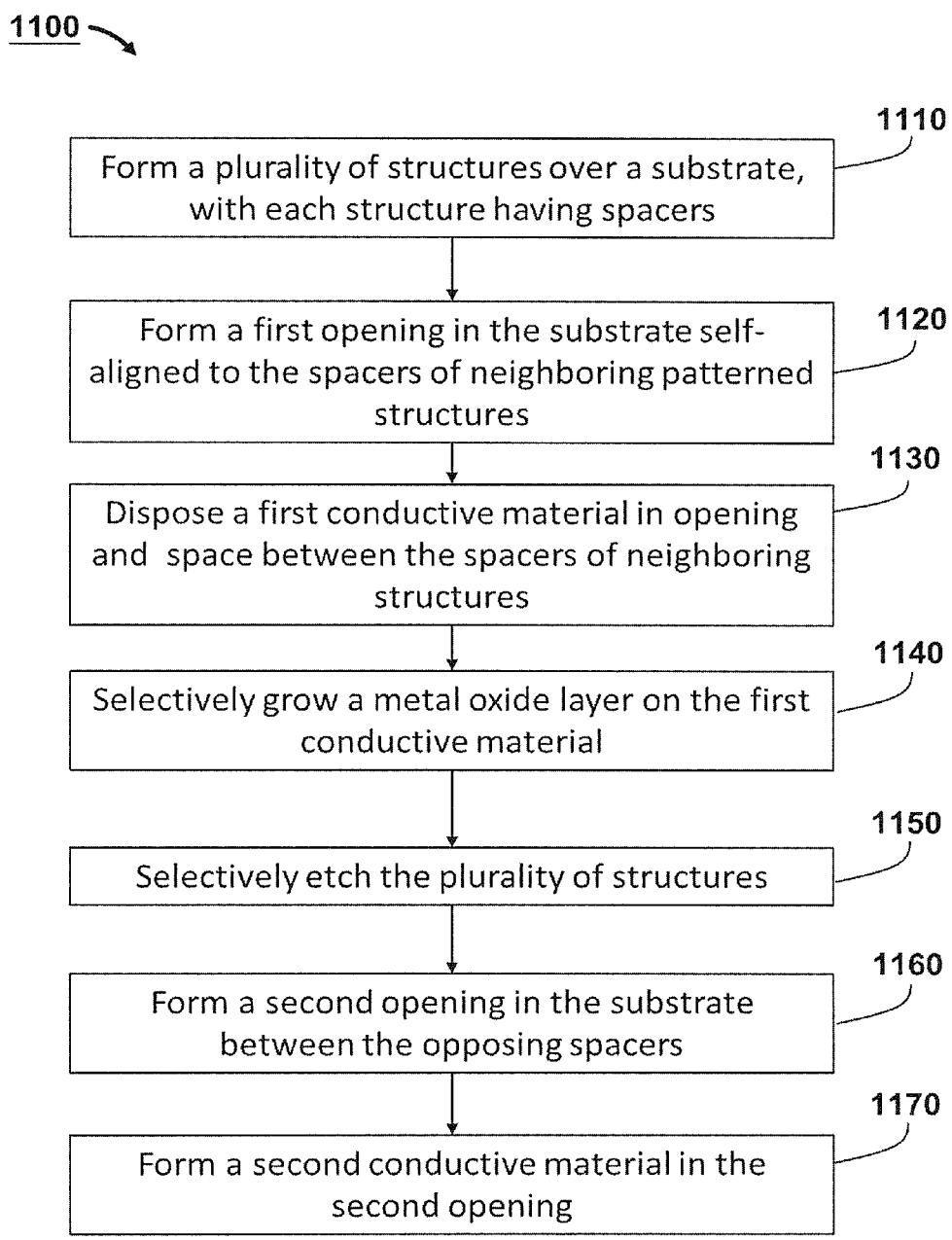
FIG. 11 is a flow diagram of an exemplary patterning fabrication method of multi-metal gap-fill, self-aligned interconnects in accordance with some embodiments.

FIG. 11 is a flow diagram of an exemplary patterning fabrication process 1100 of multi-metal fill, self-aligned interconnects, according to some embodiments. As would be understood by a person of ordinary skill in the art, other fabrication operations may be performed before, between, and/or after the various operations of method 1100 and are omitted merely for clarity. The patterning fabrication process of multi-metal fill, self-aligned metal lines is not limited to the exemplary fabrication process 1100.

In operation 1110, a plurality of mandrels 110 are formed over a substrate. Each mandrel 110 has a pair of opposing sides and a corresponding plurality of first spacers 120 and second 122 spacers, which are disposed such that each opposing side of the plurality of mandrels 110 has a spacer thereon. An exemplary substrate includes an etch stop layer 130, a low-k ILD layer 140, and an etch stop layer 150 as shown in FIG. 1. In some embodiments, mandrel 110 is made of amorphous silicon, silicon nitride or amorphous carbon. The thickness of mandrel 110 can range from 10 nm to about 100 nm. In some embodiments, spacers 120, 122 are titanium oxide, titanium nitride, silicon oxide, or silicon nitride. In some embodiments, mandrels 110 and spacers 120, 122 act as an etch mask. By way of example and not limitation, etch stop layer 130 is silicon carbide with nitrogen doping or oxygen doping, silicon nitride or silicon oxide. Etch stop layer 130 can have a thickness between 1 and 100 nm.

In operation 1120, a plurality of first openings are formed in the substrate self-aligned to the spacers of adjacent mandrels. The opening includes via openings and line openings in low-k ILD layer 140. Vias electrically connect two layers in the vertical direction, and lines make electrical connections within low-k dielectric layer 140. Operation 1120 involves several photolithography and etch operations. Referring to FIG. 2, a photoresist layer 200 is coated, photo-exposed, and patterned over structure 100 to create opening 210 with width 220. A subsequent etch process removes exposed areas of etch stop layer 130 and part of low-k ILD layer 140 through photoresist opening 210 to form partial opening 300 as shown in FIG. 3. As would be understood by a person of ordinary skill in the art, the etch process has high selectivity for low-k ILD layer 140. By way of example and not limitation, the etch process can be timed.

Photoresist 200 is then stripped and a second etch is performed. At the end of the second etch, via openings 400 and line openings 410 are complete. The second etch process also has high selectivity for low-k dielectric ILD layer 140. By way of example and not limitation, the etch process can be timed, end-pointed, or a combination of the two. For example, the etch process may be timed at the beginning of the process and end-pointed towards the end.

In operation 1130, a conductive material is disposed in the openings and in the spaces between the spacers of neighboring structures. Referring to FIG. 5, conductive material 520 has filled via openings 400 and line openings 410, which were formed in previous operation 1120. In some embodiments, conductive material 520 is Cu, Co, Al, graphene, or any other suitable conductive material. As would be understood by a person of ordinary skill in the art, conductive material 520 can be deposited with PVD, CVD, atomic layer deposition (ALD), electroplating, or any other suitable deposition technique.

In operation 1140, a metal oxide layer is selectively grown on conductive material 520. The metal oxide layer is an etch stop capping layer, such as etch stop capping layer 510 of FIG. 5. In some embodiments, etch stop capping layer 510 is a metal oxide such as an Al-based, Co-based, W-based, Ni-based, or Zr-based oxide. As would be understood by a person of ordinary skill in the art, these are merely examples and other appropriate oxides can be used. By way of example and not limitation, etch stop capping layer 510 can be deposited by CVD, PVD, or a spin-on process followed by a metal oxide patterning process.

In operation 1150, formation of additional via openings and line openings requires the removal of the plurality of structures 110 in predetermined locations according to a predetermined interconnect layout of the product being manufactured. Photolithography may be used to define the areas of structure 100 where mandrels 110 are to be removed. A selective etch process removes the exposed mandrels 110 without removing spacers 120 and 122.

In operation 1160, a second set of via openings and line openings are formed. This operation involves similar photolithography and etch processes as described in connection with operation 1120. For example, referring back to FIGS. 6-7, a coat of photoresist 600 is applied on structure 100 and then patterned. Exposed areas of etch stop layer 130 are etched through openings 610 while covered areas of structure 100 are protected from the etch. A selective process removes exposed areas of etch stop layer 130 and part of low-k ILD layer 140 through the photoresist openings to from partial opening 700. Referring to FIG. 8, photoresist is then stripped and another etch process completes the formation of via openings 800 and line openings 810. By way of example and not limitation, etch chemistry for the removal of etch stop layer 130 may be different than the etch chemistry for low-k ILD layer 140. In some embodiments, the etch processes are highly selective for etch stop layer 130 and low-k ILD layer 140, respectively. In some embodiments, the etch process is timed, end-pointed, or a combination of the two. For example, an etch process is timed in the beginning of the process and end-pointed towards the end. After the formation of via openings 800 and line openings 810, etch stop capping layer 510 is removed. In some embodiments, etch stop capping layer 510 is removed with a wet or dry etch process.

In operation 1170, a second conductive material fills the second opening(s). In FIG. 9, a conductive material 900 fills the via openings and line openings. In some embodiments conductive material 900 is different than conductive material 520. In some embodiments, conductive material 900 is Al, Co, Cu, graphene, or any suitable conductive material with appropriate resistivity. Referring to FIG. 10, a CMP process removes a top portion of structure 100 and stops at low-k ILD layer 140. In some embodiments lines or vias with different conductive material 520 and 900 are alternating.

Interconnect formation processes, in accordance with this disclosure, employ a patterning photolithography/etch process with self-aligned interconnects to increase the photolithography OVL window. In some embodiments, the OVL window is increased because alignment is accomplished on a wider pattern. A wider OVL window reduces wafer defects associated with patterning such as, for example, metal bridges and/or deformed interconnects. Patterning defects are a reliability concern that adversely impacts wafer yield. In addition, the patterning photolithography/etch process with self-aligned interconnects supports the use of a multi-metal gap fill process where the interconnects can be filled with different types of conductive material. The multi-metal gap-fill process utilizes a selective metal oxide which is grown after the first fill process to protect the first deposited metal from subsequent etch processes.

In some embodiments, a method includes a substrate, a dielectric layer over the substrate, a first pattern structure and a second pattern structure over the dielectric layer. Each of the first and second pattern structures includes a first spacer, a second spacer, and a center portion between the first and second spacers. A first opening self-aligned to a space between the first and second pattern structures is formed in the dielectric layer. A first conductive material is deposited in the first opening. The center portion of the second pattern structure is removed to form a void above the dielectric layer and between the first and second spacers of the second pattern structure. A second opening self-aligned to the void is formed in the dielectric layer, and a second conductive material is deposited in the second opening. The second conductive material is different from the first conductive material.

In some embodiments, a fabrication method includes a substrate, a dielectric layer is formed over the substrate, a first and a second pattern structures are formed over a dielectric layer. Each of the first and second pattern structures includes a first spacer, a second spacer, and a center portion between the first and second spacers. The center portions from the first and second pattern structures are removed to form openings between the first and second spacers of the first and second pattern structures. Portions of the dielectric layer under the openings are etched, and a conductive material is deposited to fill the openings and form a first interconnect layer.

In some embodiments, a semiconductor device includes a substrate, an interconnect layer formed over the substrate, a dielectric layer formed over the interconnect layer. A first conductive structure formed of a first conductive material and embedded in the dielectric layer. A second conductive structure formed of a second conductive material and embedded in the dielectric layer. The second conductive material is different from the first conductive material.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
forming a dielectric layer over the substrate;
forming a first pattern structure and a second pattern structure over the dielectric layer, wherein each of the first and second pattern structures comprises a first spacer; a second spacer, and a center portion between the first and second spacers;
forming a first opening in the dielectric layer, wherein the first opening self-aligns to a space between the first and second pattern structures;
depositing a first conductive material in the first opening;
removing the center portion of the second pattern structure to form a void above the dielectric layer and between the first and second spacers of the second pattern structure;
forming a second opening in the dielectric layer, wherein the second opening self-aligns to the void; and
depositing a second conductive material in the second opening; wherein the second conductive material is different from the first conductive material.

2. The method of claim 1, wherein the substrate comprises:
a contact metal layer for at least one transistor;
a first interconnect layer over the contact metal layer, wherein the dielectric layer is over the first interconnect layer.

3. The method of claim 1, wherein depositing the first conductive material comprises forming at least one of a via and a line in the first opening.

4. The method of claim 1, wherein depositing the second conductive material comprises forming at least one of a via and a line in the second opening.

5. The method of claim 1, further comprising:
after depositing the second conductive material in the second opening, removing the first and second pattern structures; and
removing a portion of the first conductive material, a portion of the second conductive material, and a portion of the dielectric layer.

6. The method of claim 1, wherein the first and second conductive materials comprise copper, cobalt, aluminum, or graphene.

7. The method of claim 1, further comprising:
prior to removing the center portion of the second pattern structure, selectively growing a metal oxide layer on the first conductive material to provide an etch stop capping layer on the first conductive material.

8. The method of claim 7, wherein the metal oxide layer comprise aluminum-based oxides or cobalt-based oxides.

9. A fabrication method comprising:
providing a substrate;
forming a dielectric layer over the substrate;
forming a first pattern structure and a second pattern structure over the dielectric layer, wherein each of the first and second pattern structures comprises a first spacer, a second spacer, and a center portion between the first and second spacers;
forming a photoresist layer over the first and second pattern structures;
forming first openings in the photoresist layer to expose the center portions of the first and second pattern structures, wherein the first openings are larger than the center portions of the first and second pattern structures and overlap with the first and second spacers of the first and second pattern structures;
removing the center portions from the first and second pattern structures through the first openings to form second openings smaller than the first openings between the first and second spacers of the first and second pattern structures;
etching portions of the dielectric layer under the second openings; and
depositing a conductive material to fill the second openings and to form a first interconnect layer; and
removing the photoresist layer.

10. The method of claim 9, further comprising:
etching a portion of the dielectric layer between the first and second pattern structures to form another opening, wherein the another opening aligns to the first or second spacer of the first pattern structure and to the first or second spacer of the second pattern structure; and
depositing another conductive material to fill the another opening and to form a second interconnect layer, wherein the another conductive material is different from the conductive material for the first interconnect layer.

11. The method of claim 10, further comprising:
removing the first and second spacers of the first and second pattern structures; and
removing a portion of the first and second interconnect layers, and a portion of the dielectric layer.

12. The method of claim 10, wherein the second interconnect layer comprises lines and vias.

13. The method of claim 10; wherein the conductive material and the another conductive material comprise copper, cobalt, aluminum, or graphene.

14. The method of claim 9, wherein the substrate comprises:
at least one transistor with a contact metal layer; and
a third interconnect layer over the contact metal layer; wherein the dielectric layer is over the third interconnect layer.

15. The method of claim 9, wherein the first interconnect layer comprises lines and vias.

16. A method comprising:
providing one or more interconnect layers over a substrate and a dielectric layer over the one or more interconnect layers;
forming pattern structures, wherein each of the pattern structures comprises a center portion between a first spacer and a second spacer;
forming first openings in the dielectric layer, wherein the first openings self-align to a space between the pattern structures;
depositing a first conductive material in the first openings;
removing the center portion for each of the pattern structures to form voids above the dielectric layer and between the first and the second spacers of each of the pattern structures;

forming second openings in the dielectric layer, wherein the second openings self-align to the voids; and depositing a second conductive material different from the first conductive material in the second openings.

17. The method of claim 16, wherein depositing the first conductive material comprises forming vias and lines in the first openings.

18. The method of claim 16, wherein depositing the second conductive material comprises forming vias and lines in the second openings.

19. The method of claim 16, wherein the first and second conductive materials comprise copper, cobalt, aluminum, or graphene.

20. The method of claim 16, further comprising:

prior to removing the center portion of each of the pattern structures, selectively growing a metal oxide layer on the first conductive material to provide an etch stop capping layer on the first conductive material, wherein the metal oxide layer comprises an aluminum-based oxide or a cobalt-based oxide.

* * * * *

UNITED STATES PATENT AND TRADEMARK OFFICE
CERTIFICATE OF CORRECTION

PATENT NO. : 10,026,647 B2  
APPLICATION NO. : 15/498259  
DATED : July 17, 2018  
INVENTOR(S) : Chu et al.

Page 1 of 2

It is certified that error appears in the above-identified patent and that said Letters Patent is hereby corrected as shown below:

On the Title Page

In the Drawing, delete " 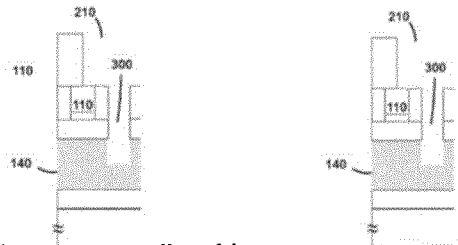 " and insert -- -- , therefor.

In the Drawings

Sheet 3 of 11, Figure 3, delete " 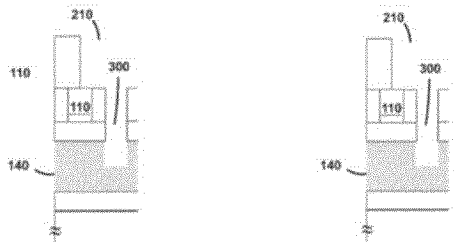 " and insert -- -- , therefor.

In the Specification

In Column 2, Line 27, delete "can divided" and insert -- can be divided --, therefor.

In Column 4, Line 54, delete "($AlO_x$)." and insert -- ($Al_2O_3$). --, therefor.

In Column 5, Line 50, delete "includes" and insert -- includes: --, therefor.

Signed and Sealed this  
Twenty-seventh Day of August, 2019

Andrei Iancu  
*Director of the United States Patent and Trademark Office*

CERTIFICATE OF CORRECTION (continued)
U.S. Pat. No. 10,026,647 B2

In Column 5, Line 51, delete "process and" and insert -- process; and --, therefor.

In Column 6, Line 41, delete "example" and insert -- example, --, therefor.

In Column 6, Line 65, delete "Al-based, a Co-based," and insert -- aluminum (Al)-based, a copper (Co)-based, --, therefor.

In Column 7, Line 54, delete "a another" and insert -- an another --, therefor.

In the Claims

In Column 11, Line 13, Claim 1, delete "method" and insert -- method, --, therefor.

In Column 11, Line 19, Claim 1, delete "spacer;" and insert -- spacer, --, therefor.

In Column 11, Line 32, Claim 1, delete "opening;" and insert -- opening, --, therefor.

In Column 11, Line 63, Claim 9, delete "method" and insert -- method, --, therefor.

In Column 12, Line 19, Claim 9, delete "openings; and" and insert -- openings; --, therefor.

In Column 12, Line 42, Claim 13, delete "10;" and insert -- 10, --, therefor.

In Column 12, Line 48, Claim 14, delete "layer;" and insert -- layer, --, therefor.

In Column 12, Line 53, Claim 16, delete "method" and insert -- method, --, therefor.